US006307367B1

United States Patent
Heid

(10) Patent No.: US 6,307,367 B1
(45) Date of Patent: Oct. 23, 2001

(54) MAGNETIC RESONANCE IMAGING APPARATUS HAVING A DEVICE FOR MEASURING MAGNETIC FIELD STRENGTHS

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/565,007

(22) Filed: May 4, 2000

(30) Foreign Application Priority Data

May 4, 1999 (DE) .............................. 199 20 429

(51) Int. Cl.$^7$ ...................................... G01V 3/00
(52) U.S. Cl. .............................. 324/300; 324/96
(58) Field of Search .......................... 324/96, 300, 318, 324/322, 304, 305; 250/225

(56) References Cited

U.S. PATENT DOCUMENTS

| 4,539,521 | * | 9/1985 | Matsumoto | 324/96 |
| 4,621,192 | * | 11/1986 | Duthoit et al. | 250/225 |
| 5,382,901 | * | 1/1995 | Okajima et al. | 324/96 |
| 5,545,980 | * | 8/1996 | Nakamoto | 324/96 |

FOREIGN PATENT DOCUMENTS 0 086 373   8/1983  (EP) .

OTHER PUBLICATIONS

Patents Abstracts of Japan, P–1017, Mar. 7, 1990, vol. 14/No. 122, for Japanese Application No. 63–150684.

* cited by examiner

*Primary Examiner*—Louis Arana
(74) *Attorney, Agent, or Firm*—Schiff Hardin & Waite

(57) ABSTRACT

A magnetic resonance imaging apparatus has a device for measuring magnetic field strengths including a light source that emits linearly polarized light, a Faraday cell that contains magneto-optically active material and that has at least one light outputs, the linearly polarized light emitted by the light source entering into the Faraday cell and traversing a prescribable number of optical path lengths therein and subsequently emerging via the corresponding light output. The device further has an analyzer for the linearly polarized light emerging from the Faraday cell, with the polarization plane of the analyzer being adjusted by a prescribable rotational angle relative to the polarization plane of the linearly polarized light emerging from the light source, and a light sensor that acquires the light emerging from the analyzer.

28 Claims, 3 Drawing Sheets

MAGNETIC RESONANCE IMAGING APPARATUS HAVING A DEVICE FOR MEASURING MAGNETIC FIELD STRENGTHS

BACKGROUND OF THE INVENTION

1. Field of the Invention

The present invention is directed to a nuclear magnetic resonance imaging apparatus having a device for measuring magnetic field strengths.

2. Description of the Prior Art

Among other things, magnetic field strengths of nuclear magnetic resonance signals for generating magnetic resonance images are measured in a magnetic resonance apparatus. To that end, the apparatus has, for example, a reception antenna fashioned as an electrical coil. In order to avoid local current densities in the reception antenna that would place a patient at risk during an RF transmission phase as a result of resonances, particularly given a local reception coil, the reception antenna is detuned or turned off in a complicated way during an RF transmission phase. Further, the coil must necessarily be fashioned of electrically conductive materials and thus disturbs the homogeneity of the basic magnetic field that is important for the image quality. Further, a gradient system of the apparatus generates rapidly switched magnetic gradient fields in the nuclear magnetic resonance apparatus for generating images.

The abstract of Japanese Application 13 16 676 discloses a device for optical magnetic field measurement based on the Faraday effect, wherein an immediate digitalization of measured results takes place without interposition of electrical analog-to-digital converters. To that end, a light source emits light that is supplied via a mirror arrangement and a polarization device to three optical paths that are formed of magneto-optical material, exhibiting a length ratio of 1:2:4 relative to one another, and which are exposed to a magnetic field to be measured. The light emerging from the paths passes through another polarization device having electrical outputs connected to comparators. An angular difference of, for example, 45° thereby exists between the polarization planes of the polarization devices. The electrical output levels of the comparators form a discrete quantity bit-by-bit whose value corresponds to the field strength of the magnetic field to be measured.

German PS 33 26 736 discloses a magnetic field measuring device likewise based on the Faraday effect and containing a Faraday cell. In one embodiment, the Faraday cell is arranged in a solenoid-like coil arrangement, and in a further embodiment, the Faraday cell is fashioned as an optical monomode fiber.

European Application 0 086 373 discloses a magnetic field measuring device based on the Faraday effect that is optimized in view of space requirements. Lead glass, bismuth silicon oxide, bismuth germanium oxide or yttrium iron silicate ($Y_3Fe_5O_{12}$) are thereby proposed as magneto-optical materials.

SUMMARY OF THE INVENTION

It is an object of the present invention to provide a magnetic resonance imaging apparatus with an improved device for measuring magnetic field strengths.

The object is inventively achieved in a magnetic resonance imaging apparatus according to the invention having a light source that emits linearly polarized light, a Faraday cell that contains magneto-optically active material and that has at least one light output, with the linearly polarized light emitted by the light source entering into the Faraday cell and traversing a prescribable number of optical path lengths therein and subsequently emerging via the light output, at least one analyzer for the linearly polarized light emerging from the Faraday cell, with the polarization plane of the analyzer being adjustable by a prescribable rotational angle relative to the polarization plane of the linearly polarized light emerging from the light source, and at least one light sensor that acquires the light emerging from the analyzer.

In contrast to known magnetic resonance apparatuses wherein, for example, a local reception antenna for the reception of nuclear magnetic resonance signals is fashioned as a coil and must therefore be detuned relative to the whole-body antenna (transmission antenna) emitting the RF pulses in order to avoid local current inductions at the patient, no resonances between the reception and transmission antenna can occur during operation of the inventive nuclear magnetic resonance apparatus. Current inductions at the patient that could lead to burns thus also do not occur. A shutoff of the reception amplifier when transmitting the RF pulse as well as a detuning for resonance reasons are therefore not required. This considerably shortens the examination times and the circuit-oriented outlay is minimized.

The above-described device is reactance-free in view of the electromagnetic compatibility so it can even be used as the reception antenna.

As explained above as an example, the above-described device can be employed for measuring magnetic field strengths of nuclear magnetic resonance signals. The device also can be employed for measuring magnetic gradient fields.

Binary information is already obtained with the aforementioned device given a Faraday cell with only one optical output. In this case, the word length amounts to one bit, and a simple yes/no information content is made available.

A "yes" level is obtained when the light sensor receives light, i.e. when a magnetic field of sufficient strength is present that causes the polarization plane of the light passing through the Faraday cell to be rotated so that the polarization plane (rotational angle $\phi_k$) of the linearly polarized light emerging from the Faraday cell coincides with the polarization plane (rotational angle $\alpha_k$) of the analyzer following the Faraday cell. In this case, the light sensor receives the light passing through the analyzer.

The rotation of the polarization plane of the light passing through the Faraday cell is thereby defined as $$\phi_k[\text{rad}] = K \cdot l_k \cdot H,$$

wherein K is the electro-optical material constant for a specific wavelength of the light (in nm), $l_k$ is the optical path length and H is the magnetic field strength acting on the Faraday cell.

A "no" level means that the magnetic field lies below the predetermined threshold, an adequate rotation of the polarization plane therefore does not occur at the light passing through the Faraday cell, and the light sensor therefore receives no light.

A "yes" level is thus obtained when $\phi_k = \alpha_k$ and a "no" level is obtained given $\phi_k \neq \alpha_k$.

The above-described device thus enables a direct digital measurement of the magnetic field strength, so that a time-consuming conversion of measured values with analog-to-digital converters is eliminated.

The above-described device also enables a nearly reactance-free measurement of the magnetic field strength, since the light that passes through the Faraday cell does not influence the magnetic field strength to be measured. As a result, the field strengths of high-frequency magnetic fields can be measured with the inventive device.

In an embodiment, the light emerging from the analyzer can be transmitted with a light waveguide having high electromagnetic compatibility before being acquired by the light sensor. As a result, the location of the actual conversion of light into an electrical-digital quantity can be conducted in electromagnetically compatible fashion in a region wherein no direct interaction of the fields generated by the (converted) electrical signal with components of the nuclear magnetic resonance apparatus occurs.

The following implementation of the device is especially well-suited for a digital measurement of the magnetic field strength with a higher resolution. The optical path length $l_k$ is geometrically graduated according to the following relationship:

$$l_k = 2^{-k} \cdot l_0,$$

whereby k=0 ... N−1 and $l_0$ is a longest magneto-optically active light path in the Faraday cell within which the Faraday effect occurs and leads to a rotation of the polarization plane of the light passing through the Faraday cell. The number of light outputs is referenced N.

The longest optical path length $l_k = l_0$ (k=0) supplies the least significant bit, in contrast to which the short optical path length $l_k = l_{N-1}$ (k=N−1) supplies the most significant bit. The magnetic field strength can thus be read directly as binary number with reference to the brightness of the analyzers.

The geometrical graduation of the optical path length $l_k$ can, for example, be achieved by providing respective Faraday cells each one light output for each optical path length increment or, given a single Faraday cell, a corresponding number of light outputs can be provided. A combination of both measures—i.e. a number of Faraday cells each with a number of light outputs—is also possible as an embodiment of the invention.

In another embodiment, two optical path lengths whose light intensities are compared to one another are provided according to the relationship $(1\pm0.5) \cdot l_k$ instead of one optical path length ($l_k$) for each geometrical graduation. Given, among other things, a modification of the magnetic field strength to be measured, a modification of all relevant bits at the same time is achieved as a result. Undefined intermediate conditions as a result of a time-offset switching of different bits are thereby prevented.

The inventive device can be adapted to the required or desired range of measurement in a simple way on the basis of selecting the length and/or the diameter of the Faraday cell (cells). In order to acquire magnetic field strengths that are twice as strong, the Faraday cell must have half the length. The desired or required digital resolution can be selected in a simple way on the basis of the number of light outputs and/or number of Faraday cells.

The magneto-optical material can be either gaseous, liquid or solid. A preferred isotropic substance is thallium oxide silicate glass. Since this substance is present in the solid aggregate state, it can directly form the Faraday cell and then, for example, be fashioned as optical fiber cable.

DESCRIPTION OF THE PREFERRED EMBODIMENTS

Figure 1:
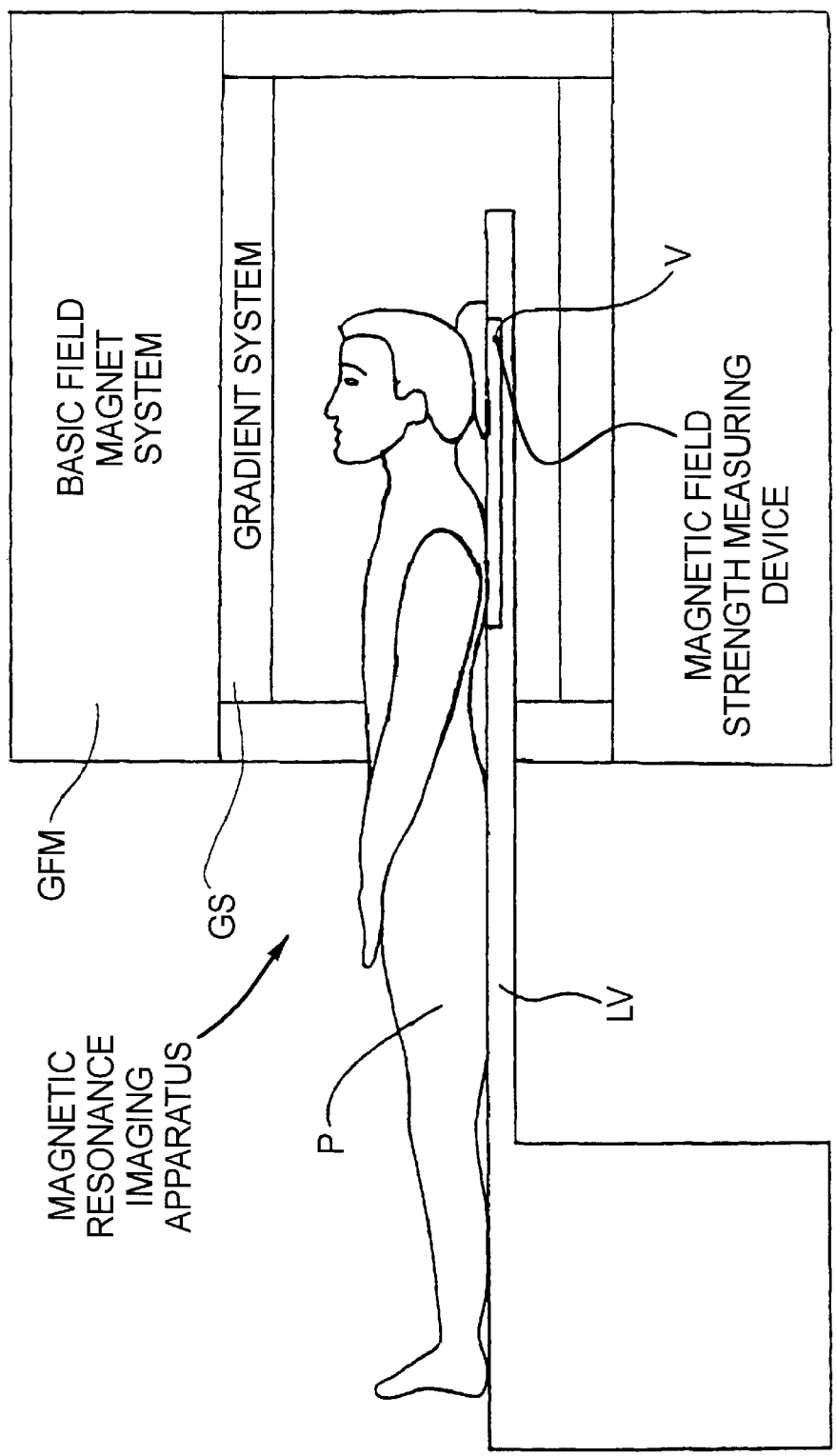
FIG. 1 shows a magnetic resonance apparatus in accordance with the invention with a device for measuring a magnetic field strength.
Figure 2:
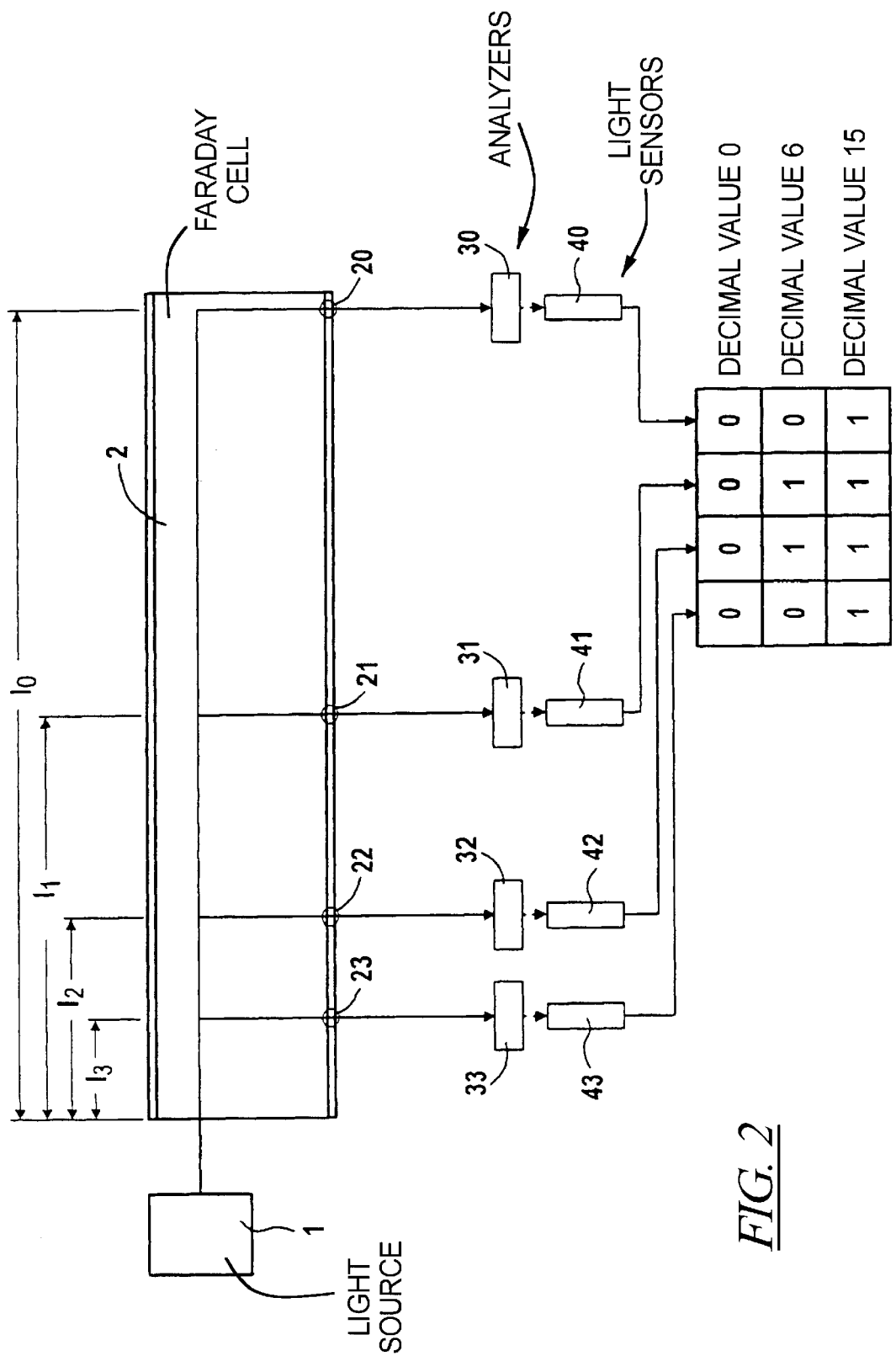
FIG. 2 shows a first embodiment of the field strength measuring device according to the invention.
Figure 3:
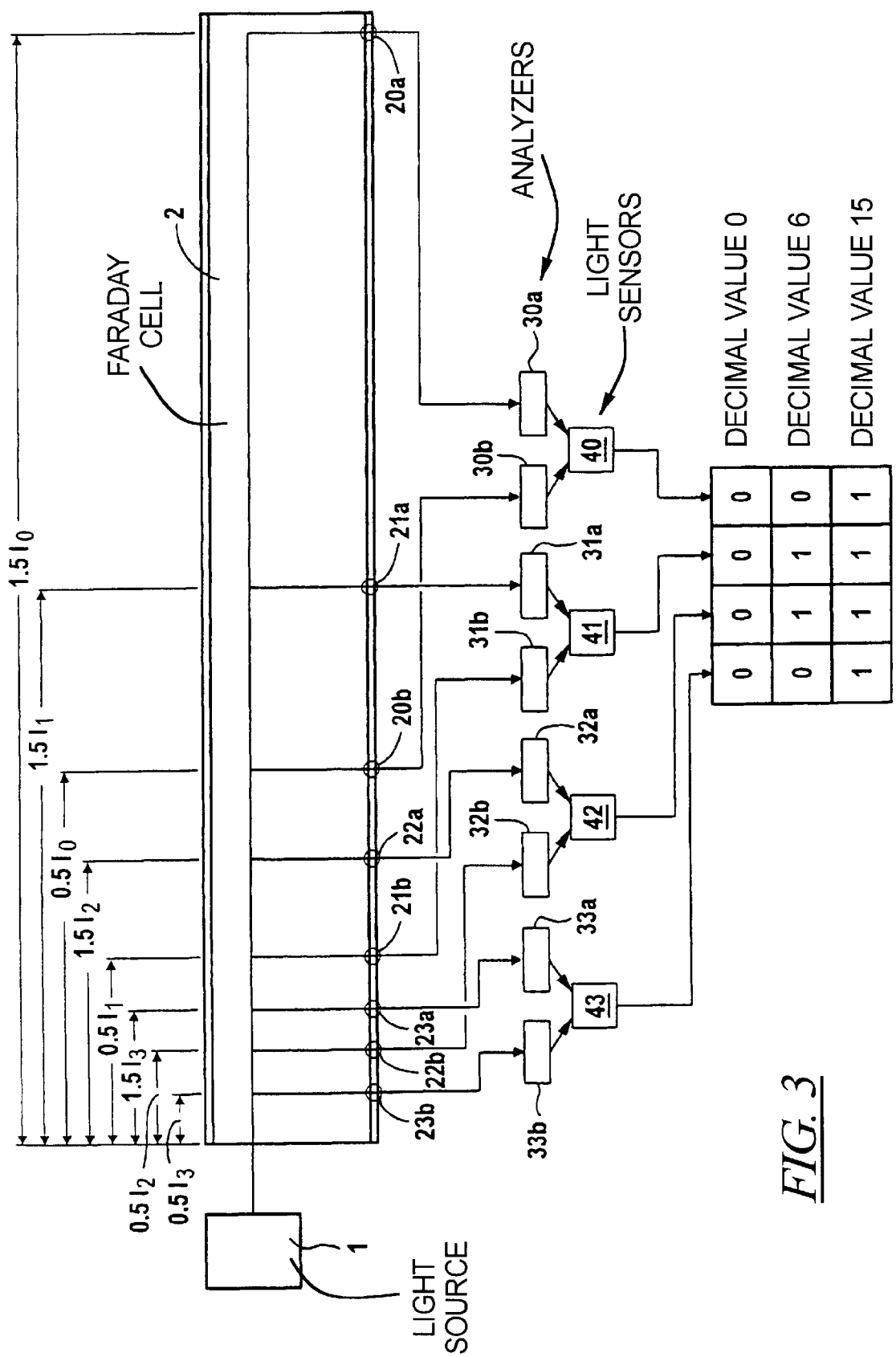
FIG. 3 shows a second embodiment of the field strength measuring device according to the invention.

As an exemplary embodiment of the invention, FIG. 1 shows a magnetic resonance imaging apparatus having a device V for measuring a magnetic field strength H. The apparatus has a basic field magnet system GFM, a gradient system GS as well as a positioning device LV on which a patient P is positioned. The device V for measuring a magnetic field strength H is fashioned to be engageable into the positioning device LV as an of example and can be fashioned as the reception antenna for receiving nuclear magnetic resonance signals and/or as a measuring unit for measuring gradient fields that are generated by the gradient system GS. FIGS. 2 and 3 show more detailed implementations of the device V.

In FIGS. 2 and 3, the device has a light source 1 that emits linearly polarized light. In the illustrated exemplary embodiment, the light source 1 is fashioned as a laser source. Instead of a laser source, however, it is also possible to employ a light source that emits unpolarized light. The light must then be linearly polarized by a polarizer following the light source, whose polarization plane preferably can be set.

The light source 1 (laser source) is followed by a Faraday cell 2. The Faraday cell 2 is filled with a magneto-optically active material, with thallium oxide silicate glass $39Tl_2O^*61Si_2 O$ in the illustrated exemplary embodiment.

The linearly polarized light emitted by the light source 1 enters into the Faraday cell 2 and traverses a number of optical path lengths $l_k$ in the Faraday cell 2. The light intensity thereby varies periodically according to $[\sin(K \cdot l_k \cdot H)]^2$ with the applied magnetic field strength. The absolute sensitivity of the inventive device is defined by the longest magneto-optically active light path $l_0$ (maximum value of the optical path length $l_k$) and by the magneto-optical material constant K. For thallium oxide silicate glass, the magneto-optical material constant amounts to $K = 44 \cdot 10^{-6}$ rad/A, wherein rad indicates the radians and A is the intensity of the current.

In the exemplary embodiment of the inventive device for measuring magnetic field strengths shown in FIG. 2, the Faraday cell 2 has a respective light outputs 20 through 23 for a selectable number of optical path lengths $l_k$. The linearly polarized light emerges from the Faraday cell 2 via the light outputs 20 through 23.

The optical path lengths $l_k$ are geometrically graduated according to the following relationship:

$$l_k = 2^{-k} \cdot l_0,$$

wherein k=0 ... N−1 and $l_0$ is the longest magneto-optically active light path in the Faraday cell within which the Faraday effect occurs and leads to a rotation of the polarization plane of the linearly polarized light passing through the Faraday cell 2. N is the number of light outputs. Given the embodiment shown in FIG. 2, N=4 and thus k=3.

The longest optical path length $l_k = l_0$ (k=0) supplies the least significant bit (in the example, $0001_2 = 1_{10}$). whereas the shortest optical path length $l_k = l_3$ (k=3 because N=4) supplies the most significant bit (in the example, $1000_2 = 8_{10}$). Due to the geometrical graduations, $$l_1 = 0.5 \cdot l_0$$

$l_2 = 0.25 \cdot l_0$ $l_3 = 0.125 \cdot l_0$ for the embodiment shown in FIG. 2.

The linearly polarized light emerging from the Faraday cell 2 via the light output 20 proceeds into an analyzer 20 fashioned as a polarizer, whose polarization plane is rotated by a prescribable rotational angle of, for example, $\alpha_0 = 90°$ relative to the polarization plane of the linearly polarized light emerging from the light source 1. The analyzer 30 is followed by a light sensor 40 (photosensor) that acquires the light emerging from the analyzer 30.

Analogously, the light output 21 has an analyzer 31 (polarization filter) allocated to it whose polarization plane is rotated by a rotational angle $\alpha_1 = 180°$ relative to the polarization plane of the linearly polarized light emerging from the light source 1 in the exemplary embodiment. The analyzer 31 is followed by a light sensor 41.

An analyzer 32 likewise acting as polarization filter with a rotational angle $\alpha_2 = 360°$ as well as a light sensor 42 are allocated to the light outfeed 22.

An analyzer 33 (polarization filter) with a rotational angle $\alpha_3 = 720°$ and a light sensor 43 are allocated to the light output 23.

The product $l_k \cdot \alpha_k$ of the optical path length $l_k$ and rotational angle $\alpha_k$ is thus constant.

The magnetic field strength H to which the device is exposed thus can be read directly as a binary number from the brightness of the analyzers 30 through 33.

In the embodiment illustrated in FIG. 3, the precision demands made on the optical path lengths $l_k$ and the threshold recognition of the light intensities at the analyzers 30 through 33 can be reduced by providing two optical path lengths according to the relationship.

$(1 \pm 0.5) \cdot l_k$, for each geometrical graduation instead of one optical path length $l_k$, the respective light intensities in these two paths being compared with one another.

The linearly polarized light that traverses the optical path lengths $0.5 \cdot l_0$ and $1.5 \cdot l_0$ in the Faraday cell 2 is supplied to respective analyzers 30a or and 30b via light outputs 20a and 20b. Analogously, respective light outputs 21a and 21b as well as respective analyzers 31a and 31b are allocated to the optical path lengths $0.5 \cdot l_1$ and $1.5 \cdot l_1$. A respective light outputs 22a and 22b as well as respective analyzers 32a and 32b are allocated to the optical path lengths $0.5 \cdot l_2$ and $1.5 \cdot l_2$. Further, respective light outputs 23a and 23b as well as respective analyzers 33a and 33b are allocated to the optical path lengths $0.5 \cdot l_3$ and $1.5 \cdot l_3$.

The relationship $l_1 = 0.5 \cdot l_0$ $l_2 = 0.25 \cdot l_0$ $l_3 = 0.125 \cdot l_0$ apply for the optical path lengths $(1 \pm 0.5) \cdot l_k$.

In this exemplary embodiment, as well, the magnetic field strength H to which the device is exposed can be directly read as a binary number from the brightness of the analyzers 30a through 33a and 30b through 33b. The brightnesses of the analyzers 30a through 33a and 30b through 33b are acquired in pairs by light sensors 40 through 43 for this purpose.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance imaging apparatus comprising:

means for exciting nuclear magnetic resonance signals in a subject, said nuclear magnetic resonance signals having a magnetic field associated therewith having a field strength; and a device for measuring field strength comprising:

a light source which emits linearly polarized light;

a Faraday cell, exposed to said magnetic field and supplied with said linearly polarized light, containing magneto-optically active material and having at least one light output, said linearly polarized light traversing a prescribable plurality of optical path lengths in said material and emerging via said at least one light output with an intensity dependent on said field strength;

at least one analyzer supplied with said light emerging from said at least one light output of said Faraday cell, said at least one analyzer having a polarization plane which is adjustable by a prescribable rotational angle relative to a polarization plane of the linearly polarized light to admit a portion of said light emerging from said at least one light output of said Faraday cell through said analyzer; and at least one light sensor on which said light admitted through said at least one analyzer is incident and which emits a signal dependent on said intensity as a measure of said field strength.

2. The magnetic resonance imaging apparatus of claim 1 wherein said optical path lengths are geometrically graduated according to:

$l_k = 2^{-k} \cdot l_0$, wherein $l_k$ represents optical path lengths for $k = 0 \ldots N-1$, N is a plurality of said light outputs of said Faraday cell, and $l_0$ is a longest magneto-optically active light path in said Faraday cell.

3. The magnetic resonance imaging apparatus of claim 2 wherein a product of said optical path length $l_k$ and said rotational angle is constant.

4. The magnetic resonance imaging apparatus of claim 3 wherein said product is $l_0 \cdot 90°$.

5. The magnetic resonance imaging apparatus of claim 2 wherein, for each geometrical graduation, said Faraday cell has two optical path lengths of respective lengths l, according to a relationship $(1 \pm 0.5) \cdot l_k$, with each of said two optical path lengths having a light intensity, and said device comprising a comparator, for each geometrical graduation, which compares the respective intensities of the two optical path lengths for that geometrical graduation.

6. The magnetic resonance imaging apparatus of claim 1 comprising a separate Faraday cell for each of said path lengths.

7. The magnetic resonance imaging apparatus of claim 1 comprising a single Faraday cell having a plurality of light outputs respectively for the path lengths in said plurality of path lengths.

8. The magnetic resonance imaging apparatus of claim 1 wherein said magneto-optically active material is thallium oxide silicate glass.

9. The magnetic resonance imaging apparatus of claim 1 wherein said light source includes at least one polarizer having a selectively settable polarization plane.

10. The magnetic resonance imaging apparatus of claim 1 comprising a plurality of separate light sources and a plurality of Faraday cells, said Faraday cells respectively being allocated to said light sources and each of said Faraday cells containing one of said optical paths.

11. The magnetic resonance imaging apparatus of claim 1 comprising a plurality of Faraday cells, each containing one of said optical paths, and a single light source allocated in common to said plurality of Faraday cells, and a mirror arrangement for supplying said linearly polarized light to said plurality of Faraday cells.

12. The magnetic resonance imaging apparatus of claim 1 wherein said light source comprises a laser light source.

13. The magnetic resonance imaging apparatus of claim 1 further comprising a solenoid coil, charged with a current having a current intensity to be measured, in which said Faraday cell is disposed for measuring a magnetic field which is proportional to said current intensity to be measured.

14. The magnetic resonance imaging apparatus of claim 1 wherein said Faraday cell comprises a fiber-optic cable.

15. The magnetic resonance imaging apparatus of claim 1 comprising a plurality of separate light sources and a plurality of Faraday cells, said Faraday cells respectively being allocated to said light sources and each of said Faraday cells containing one of said optical paths.

16. A magnetic resonance imaging apparatus comprising:
   means for exciting nuclear magnetic resonance signals in a subject and a gradient system, for generating at least one gradient magnetic field for spatially encoding said nuclear magnetic resonance signals, said gradient magnetic field having a field strength; and
   a device for measuring field strength comprising:
     a light source which emits linearly polarized light;
     a Faraday cell, exposed to said magnetic field and supplied with said linearly polarized light, containing magneto-optically active material and having at least one light output, said linearly polarized light traversing a prescribable plurality of optical path lengths in said material and emerging via said at least one light output with an intensity dependent on said field strength;
     at least one analyzer supplied with said light emerging from said at least one light output of said Faraday cell, said at least one analyzer having a polarization plane which is adjustable by a prescribable rotational angle relative to a polarization plane of the linearly polarized light to admit a portion of said light emerging from said at least one light output of said Faraday cell through said analyzer; and
     at least one light sensor on which said light admitted through said at least one analyzer is incident and which emits a signal dependent on said intensity as a measure of said field strength.

17. The magnetic resonance imaging apparatus of claim 16 wherein said optical path lengths are geometrically graduated according to:

$$l_k = 2^{-k} \cdot l_0,$$

wherein $l_k$ represents optical path lengths for $k=0 \ldots N-1$, N is a plurality of said light outputs of said Faraday cell, and $l_0$ is a longest magneto-optically active light path in said Faraday cell.

18. The magnetic resonance imaging apparatus of claim 17 wherein a product of said optical path length $l_k$ and said rotational angle is constant.

19. The magnetic resonance imaging apparatus of claim 18 wherein said product is $l_0 \cdot 90°$.

20. The magnetic resonance imaging apparatus of claim 17 wherein, for each geometrical graduation, said Faraday cell has two optical path lengths of respective lengths l, according to a relationship $(1\pm0.5) \cdot l_k$, with each of said two optical path lengths having a light intensity, and said device comprising a comparator, for each geometrical graduation, which compares the respective intensities of the two optical path lengths for that geometrical graduation.

21. The magnetic resonance imaging apparatus of claim 16 comprising a separate Faraday cell for each of said path lengths.

22. The magnetic resonance imaging apparatus of claim 16 comprising a single Faraday cell having a plurality of light outputs respectively for the path lengths in said plurality of path lengths.

23. The magnetic resonance imaging apparatus of claim 16 wherein said magneto-optically active material is thallium oxide silicate glass.

24. The magnetic resonance imaging apparatus of claim 16 wherein said light source includes at least one polarizer having a selectively settable polarization plane.

25. The magnetic resonance imaging apparatus of claim 16 comprising a plurality of Faraday cells, each containing one of said optical paths, and a single light source allocated in common to said plurality of Faraday cells, and a mirror arrangement for supplying said linearly polarized light to said plurality of Faraday cells.

26. The magnetic resonance imaging apparatus of claim 16 wherein said light source comprises a laser light source.

27. The magnetic resonance imaging apparatus of claim 16 further comprising a solenoid coil, charged with a current having a current intensity to be measured, in which said Faraday cell is disposed for measuring a magnetic field which is proportional to said current intensity to be measured.

28. The magnetic resonance imaging apparatus of claim 16 wherein said Faraday cell comprises a fiber-optic cable.

* * * * *